US006260261B1

(12) United States Patent
Marks et al.

(10) Patent No.: US 6,260,261 B1
(45) Date of Patent: Jul. 17, 2001

(54) STRADDLE-MOUNT ASSEMBLY TOOL AND METHOD

(75) Inventors: Christopher Marks, Guilford; Andrzej H. Lux, Kirkwood, both of NY (US)

(73) Assignee: Universal Instruments Corporation, Kirkwood, NY (US)

( * ) Notice: Subject to any disclaimer, the term of this patent is extended or adjusted under 35 U.S.C. 154(b) by 0 days.

(21) Appl. No.: 09/430,032

(22) Filed: Oct. 29, 1999

(51) Int. Cl.[7] ...................................................... H05K 3/30

(52) U.S. Cl. ................................ 29/740; 29/739; 29/721; 29/741; 29/832; 29/833; 414/744.6

(58) Field of Search ............................. 29/741, 721, 743, 29/720, 740, 739, 832, 833; 414/744.6

(56) References Cited

U.S. PATENT DOCUMENTS

| | | | | |
|---|---|---|---|---|
| 4,819,326 | * | 4/1989 | Stannek | 29/837 |
| 5,007,162 | * | 4/1991 | Weeber | 29/740 |
| 5,342,460 | * | 8/1994 | Hidese | 29/740 |
| 5,743,005 | * | 4/1998 | Nakao et al. | 29/740 |
| 5,850,689 | * | 12/1998 | Mogi et al. | 29/834 X |
| 5,878,484 | * | 3/1999 | Araya et al. | 29/740 |
| 5,885,052 | * | 3/1999 | Tsuji et al. | 414/744.6 |

OTHER PUBLICATIONS

AMP; Application Tool 767511; pp. 1–6; 1996.

Budgetary/Technical Proposal for Solectron—Austin; MICTOR Connector RFQ #98050; pp. 1–4; May 5, 1998.

Celestica Toronto; Universal Instruments Corporation; pp. 1–7; Aug. 7, 1998.

* cited by examiner

*Primary Examiner*—Gregory L. Huson
*Assistant Examiner*—Rick Kiltae Chang
(74) *Attorney, Agent, or Firm*—Burns, Doane, Swecker & Mathis, L.L.P.

(57) ABSTRACT

An assembly tool for attaching components such as connector plugs or receptacles to a printed circuit board includes a printed circuit board support plate and a sliding member. The sliding member is movable between a first position and a second position relative to the support plate. A holder is pivotally connected to the sliding member and carries a component to be attached to the printed circuit board. A first actuator is connected to a sliding member and moves the sliding member between the first and second positions. A second actuator is connected to the holder and pivots the holder between a receiving position and a mounting position. A component is brought into proximity with the holder and checked for alignment and polarity. Once checked, the component is placed on the holder. The actuators pivot the holder into alignment with the printed circuit board and slide the slidable member toward the printed circuit board to register the component with the edge of the printed circuit board, thereby attaching the component thereto.

11 Claims, 5 Drawing Sheets

STRADDLE-MOUNT ASSEMBLY TOOL AND METHOD

BACKGROUND

1. Field of the Invention

The present invention relates to a tool for attaching straddle-mounted edge components to a printed circuit board, and more particularly, to a tool that automatically attaches such components to an edge of a printed circuit board.

2. Description of Related Art

Printed circuit boards are common in personal computers and other electronic devices. Many times, printed circuit boards are connected to cables or other mechanical or electrical mechanical parts of the electronic devices through straddle-mounted or edge components, such as plugs and receptacles, mounted on edges of the circuit boards. The straddle-mounted or edge components are attached to an edge of the circuit board such that the edge component straddles, or overlaps, opposing surfaces of the printed circuit board. When attaching the edge components to a printed circuit board, it is important that the edge component be accurately aligned with the circuit board and that the edge component be attached without damaging the electronics of the printed circuit board or the printed circuit board itself.

In view of the complexity of modern circuits, an assembled printed circuit board can be quite densely packed. As a result, automated equipment for assembling such printed circuit boards must utilize a significant amount of loading elements in a relatively small space. Accordingly, it is desirable that the equipment for assembling the printed circuit board take up as little space as possible. Furthermore, in view of the large number of components that may be assembled onto a board, it is important that such components be loaded as quickly as possible. Another desirable feature of circuit board assembly equipment is that such equipment be as accurate as possible in order to minimize damage, and thus waste, to the components being assembled.

One conventional assembly tool for assembling edge components to printed circuit boards is the AMP Application Tool 767511 distributed by AMP, Incorporated, Harrisburg, Pa. The AMP tool includes a support plate for receiving a circuit board and a "pusher pivoting block" for holding an edge component. The pusher pivoting block is hinged at one end thereof to a mid-section of a base portion and includes an "inserter" for temporarily holding an edge component at another end thereof. The base portion includes a first end that is adjacent the support plate. However, the hinge connecting the pusher pivoting block to the base portion is located at a position on the base portion away from the support plate. Thus, the pivot point for the pusher pivoting block is separated from the circuit board support plate. As a result of this construction, the pusher pivoting block must be of a significant length and requires the end on which the edge component is temporarily held to swing through a relatively large arc. Furthermore, the inserter is specifically designed for each connector size, and must be ordered separately. In operation, the pusher pivoting block is manually lifted or pivoted upwardly so that an edge connector can be placed onto the inserter. After the edge connector is manually placed onto the inserter, the pusher pivoting block is manually returned to its lower, horizontal position, wherein it is substantially parallel with the base portion so that the edge component is in alignment with the printed circuit board. An operator then pulls a handle or manipulates other means to manually move the pusher pivoting block toward the circuit board so as to force the properly aligned edge component onto the circuit board.

However, the use of the AMP tool is manual labor intensive and requires a large space for the pusher pivoting block to pivot. Furthermore, because the AMP tool is intended to be operated manually, the operation is inherently slow, and is likely to result in inconsistent quality. For example, if the edge components are not handled properly, the leads of the components may be bent, or otherwise damaged.

OBJECTS AND SUMMARY

Accordingly, prior to the present invention, there was a need for an assembly tool that automatically aligns an edge component with a printed circuit board, as well as automatically attaches the edge component to the printed circuit board so as to increase the efficiency of assembly of assembling printed circuit boards with straddle-mounted edge components.

There was also a need for an automatic assembly tool that was space efficient.

The present invention relates to an assembly tool and method for automatically attaching straddle-mounted edge components to a printed circuit board. The present invention decreases the cycle time between attachments, and greatly reduces the occurrence of damage or assembly errors to the edge components and printed circuit boards due to manual handling of the edge components during the assembly process as compared to conventional assembly tools. Furthermore, the present invention can contribute to a more ergonomic manufacturing environment as compared to a conventional assembly tool by eliminating repetitive manual manufacturing steps. And, the assembly tool and method of the present invention are more space efficient than the prior art tools and methods.

According to one aspect of the present invention, an assembly tool includes a support plate that supports a printed circuit board during the attachment process and a sliding member which is movable between a first position and a second position relative to the support plate. A holder that is pivotably connected to one end of the sliding member receives and carries an edge component to be connected to the printed circuit board. A first actuator is connected to the sliding member and moves the sliding member between the first position and the second position. A second actuator is connected to the holder. The second actuator pivots the holder between a receiving position and a mounting position. The actuators move the holder and sliding member of the tool to first receive an edge component for attachment and then attach the edge component to an edge of a printed circuit board.

Another aspect of the present invention includes a method for automatically connecting edge components to a printed circuit board. According to the method, a printed circuit board is located on a support plate, and an edge component is positioned on a holder. A first actuator is then automatically activated to pivot the holder so that the edge component is aligned with an edge of the printed circuit board. Subsequently, a second actuator automatically forces the holder toward the printed circuit board and secures the edge component thereto.

BRIEF DESCRIPTION OF THE DRAWINGS

The objects and advantages of the invention will be understood by reading the following detailed description in conjunction with the drawings in which.

DETAILED DESCRIPTION OF THE PREFERRED EMBODIMENT

A straddle-mount assembly tool in accordance with the present invention is space efficient and decreases the cycle time between each mounting of an edge component to a printed circuit board. It also improves the accuracy and repeatability of such a mounting, and eliminates both damage to the assembled edge components and assembly errors caused by manual handling of the printed circuit board and mounted edge components. As a result, manufacturing costs are reduced.

For a better understanding of the invention, the following detailed description refers to the accompanying drawings, wherein an exemplary embodiment of the present invention is illustrated and described.

Figure 1:
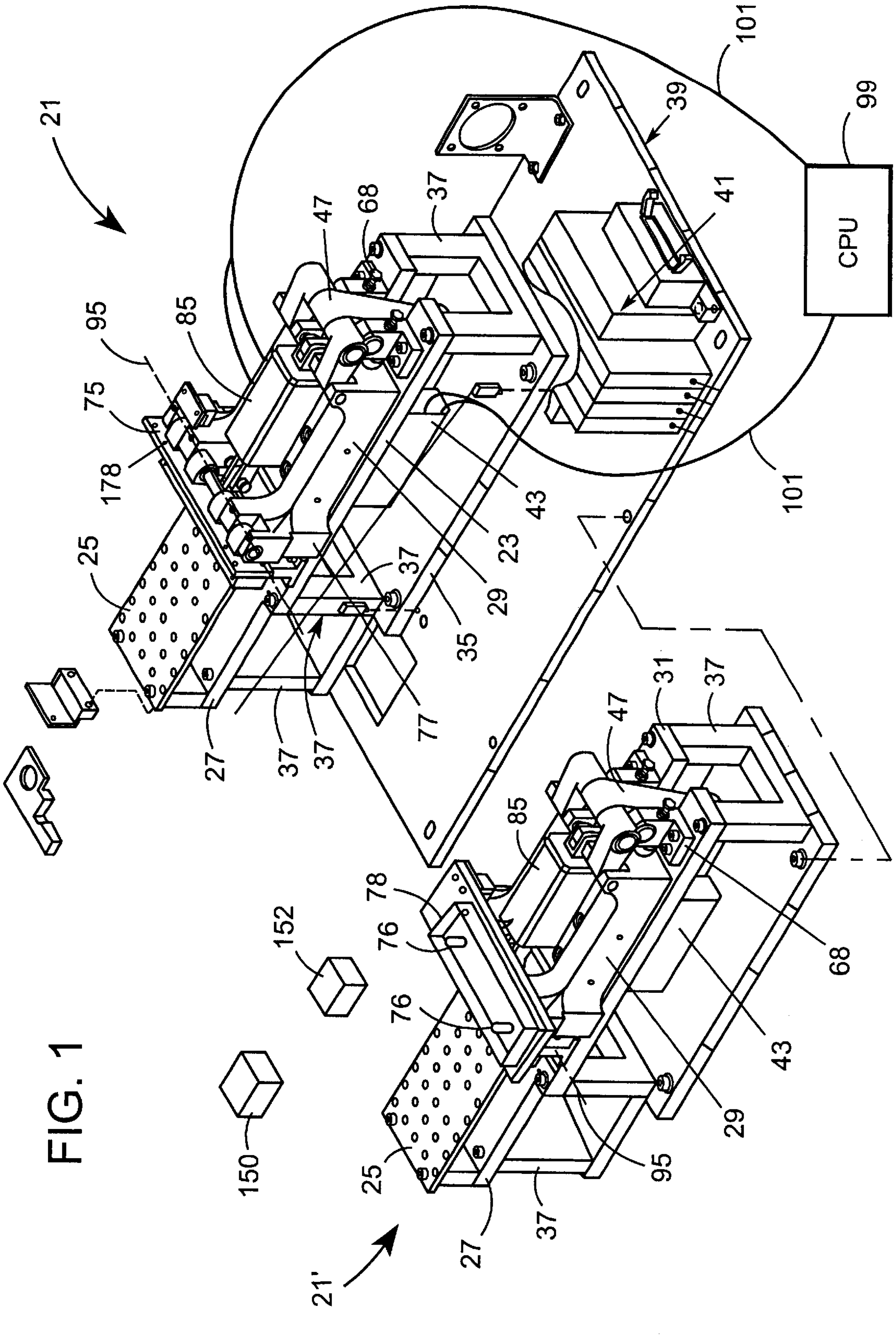
FIG. 1 is a perspective view of exemplary straddle mount assembly tools in accordance with the present invention.
Figure 2:
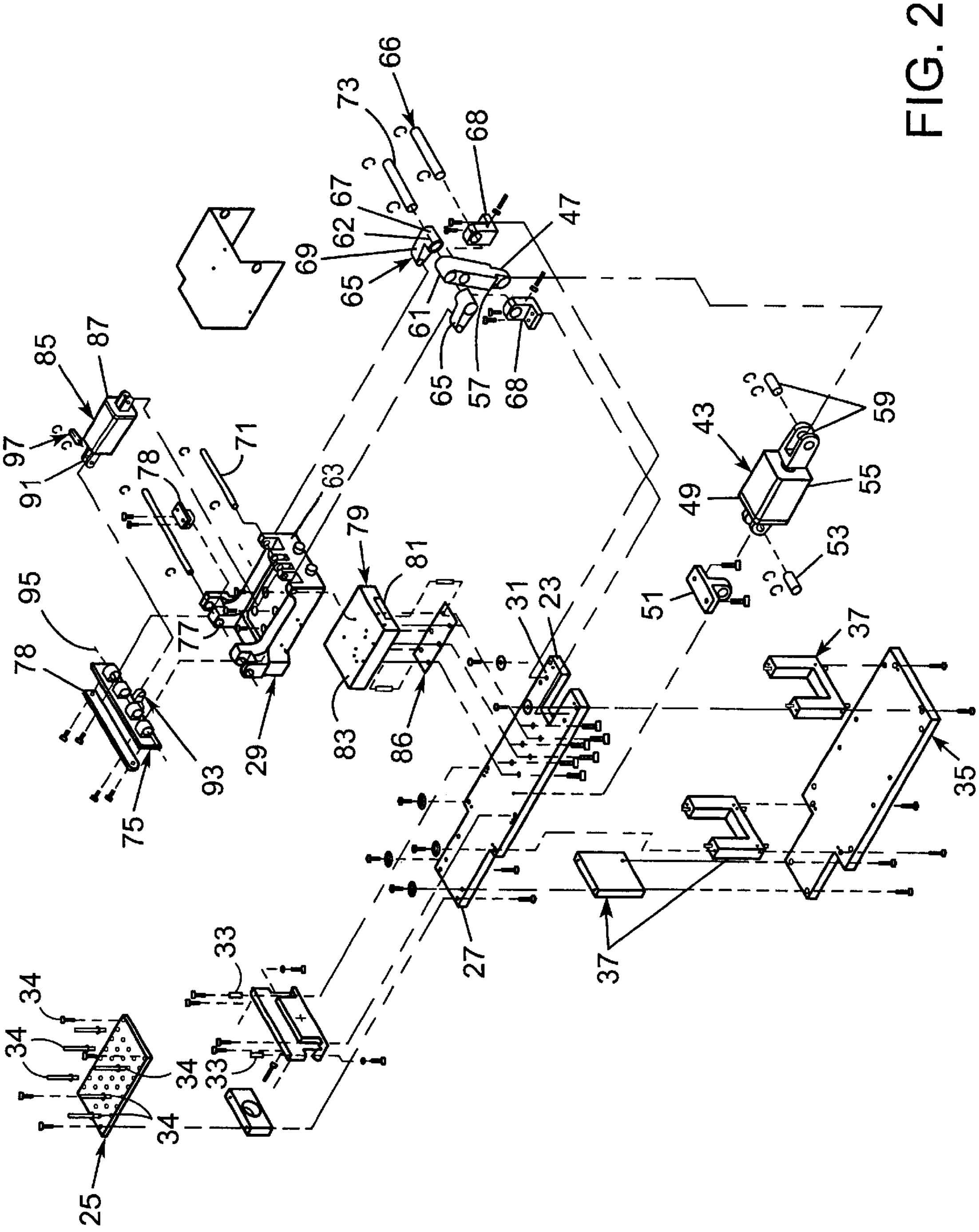
FIG. 2 is an exploded perspective view of one of the straddle mount assembly tools shown in FIG. 1.

An exemplary embodiment of a straddle-mount assembly tool 21 according to the present invention is shown in FIGS. 1–3. The exemplary tool 21 functions in conjunction with a conventional printed circuit board assembly system, otherwise known as a pick and place apparatus. One example of a pick and place assembly system that may be used in conjunction with the present invention is the GSM brand pick and place system marketed by Universal Instruments Corporation of Binghamton, N.Y. The assembly system moves a printed circuit board into and out of proximity with the tool 21. The assembly system is not described in detail except insofar as it interacts with the tool 21.

As will be explained below, FIG. 1 illustrates two tools 21, 21' for mounting in a side by side manner. The two tools 21, 21' are shown in different stages of the operating cycle, as will be explained below in greater detail. Although FIG. 1 illustrates two tools 21, 21', it is not necessary for the tools of the present invention to be used in combination. A single tool 21 can be used, if appropriate, depending on the assembly requirements of a particular circuit board setup. FIG. 2 is an exploded view of an individual tool 21, and FIGS. 3(A) through 3(D) illustrate an operation sequence of the tool 21.

Each of the straddle-mount assembly tools 21 includes a platform 23. A printed circuit board support plate 25 is connected to one end 27 of the platform 23, and a sliding member 29 is mounted on another end 31 of the platform 23.

The platform 23, including both tools 21, 21', is raised to receive a printed circuit board on the support plate 25. The printed circuit board is held in place on the support plate 25 by locator pins 33 and by clamps that are part of the assembly system used in conjunction with the tool 21. The locator pins 33 are located so as to register with openings in the printed circuit board. The locator pins 33 are arranged in a desired manner so as to accommodate a particular printed circuit board. In addition, as can be seen in FIG. 2, support pins 34 can be mounted on the support plate 25 to support the printed circuit board. The support pins can be useful to prevent a large printed circuit board from sagging or flexing in a middle section.

The platform 23 is mounted above a tool support plate 35 by means of support brackets 37. A space between the platform 23 and the tool support plate 37 can accommodate flexible connections of the tool, including air lines (not shown) and input/output lines.

As seen in FIG. 1, one or more tools 21 can be mounted to a tool plate 39, which can be integrated into a printed circuit board assembly system. The tool plate 39, and the tools 21, 21', are raised by a conventional pneumatic lift assembly (not shown) to which the tool plate 39 is attached. The tool plate 39 also supports a manifold and valve assembly 41 for controlling air flow to the tool's actuators.

The sliding member 29 is movable along the adjustable platform 23 from a first position near the end 31 of the platform 23 to a second position near the circuit board support plate 25. In the first position the sliding member 29 receives an edge component for assembly with the printed circuit board. In the second position, the sliding member 29 forcibly mounts the received edge component onto an edge of the printed circuit board supported by the support plate 25 and the support pins 34.

The sliding member 29 is moved by a first actuator, such as an air cylinder 43, mounted to an underside of the platform 23. However, other types of actuators known to those of skill in the art, such as electric motors, may be used instead of an air cylinder. The air cylinder 43 drives a bell crank 47 connected to the sliding member 29, and through the bell crank 47, applies a force to the sliding member 29 in the direction of the end 27 of the platform 23. One end 49 of the air cylinder 43 is connected to the platform 23 with a clevis block 51 and shaft 53. A second end 55 of the air cylinder 43 is pivotably connected to a lower end 57 of the bell crank 47 by a rod-eye clevis joint 59.

An upper end 61 of the bell crank 47 is pivotably connected to the sliding member 29 by clevis links 65. The connection between the air cylinder 43 and the bell crank 47 allows the bell crank 47 to rotate in response to actuations of the air cylinder 43.

The bell crank 47 is pivotally held by a shaft 66 that is supported by blocks 68. The shaft 66 acts as fulcrum about which the bell crank 47 pivots.

Each of the clevis links 65 has a first end 67 and a second end 69. The second end 69 of each clevis link 65 rotates about a shaft 71 rotatably mounted to a first end 63 of the sliding member 29. The first end 67 of each clevis link 65 rotates about a shaft 73 rotatably held in the upper end 61 of the bell crank 47. Other types of connections between the actuator and the sliding member 29 may be used.

When the air cylinder 43 exerts a force against the lower end 57 of the bell crank 47 in a direction away from the circuit board support plate 25, the bell crank 47 is rotated and, in turn, exerts a force on the sliding member 29 toward the printed circuit board support plate 25, causing the sliding member 29 to move toward the support plate 25. Conversely, when the air cylinder 43 pulls the lower end 57 of the bell crank 47 in a direction toward the circuit board support plate 25, the bell crank 47 is rotated and, in turn, exerts a force on the sliding member 29 causing the sliding member 29 to move away from the support plate 25.

An edge component holder 75 is pivotally mounted at one end 77 of the sliding member 29. The holder 75 pivots between a first or receiving position where an edge component can be placed on the holder 75 and a second or mounting position where the edge component is in alignment with a printed circuit board held by the support plate 25. Preferably, in the first position, the holder 75 is facing upward. And the second position is preferably rotated approximately 90° from the first position. In FIG. 1, the tool 21 on the left side of the figure is illustrated with the holder 75 arranged in the first or receiving position, and the tool 21' on the right side of the figure is illustrated with the holder in the second or mounting position.

Because the holder 75 is mounted at an end 77 of the sliding member 29 that is adjacent to the support plate 25, the holder 75 can be made relatively small in size, and the arc made by the receiving surface of the holder 75 is similarly small when the holder 75 rotates from the first position to the second position. As a result, the tool 21 can be made relatively small, and thus light in weight. And, because of the small arc encompassed by the rotation of the holder 21, the tool 21 can operate in a minimum amount of space and at a relatively fast speed.

A sensor is mounted on a sensor bracket 178 attached to the end 77 of the sliding member 29 proximate the pivoting holder 75. The sensor determines whether the holder 75 is in the receiving position. If it is determined that the holder 75 is in the receiving position, the edge component can be placed on the holder 75 with a separate automatic placing tool or head (not shown). Locator pins 76 on the holder 75 register with holes in the edge component to hold the edge component in its proper place.

The holder 75 may include a holding tool 78 that is replaceably mounted to the holder 75. The holding tool 78 is preferably specifically configured for the edge component being applied. And, the holding tool 78 can be easily removed from the holder 75 for easy replacement through known means, such as screws or other commonly used fastening devices.

The sliding member 29 is slidable along the platform 23 on a slide 79 between the first and second positions. The slide 79 includes a guide 81, which is fixed to the platform 23, and a movable member 83 which fits over the guide 81. The movable member 83 slides along a path defined by the guide 81. A shim 86 may be located between the guide 81 and the platform 23 to allow the movable member 83 to slide along the guide 81 without contacting the platform 23 below. The shim 86 also functions to enable positioning the holder 75 in a proper vertical alignment with a printed circuit board on the support plate 25. The sliding member 29 is connected to a top surface of the movable member 83 and therefore slides with the movable member across the platform 23.

A second actuator, such as an air cylinder 85, is attached to the sliding member 29 and the holder 75. However, other types of actuators known to those of skill in the art, such as electric motors, may be used instead of an air cylinder. The air cylinder 85 pivots the holder 75 between the receiving and mounting positions. A first end 87 of the air cylinder 85 is rotatably connected to the shaft 71 in the sliding member 29. A second end 89 of the air cylinder 85 includes a cut cylinder clevis 91 that fits over a clevis pivot block 93 secured to the holder 75 and offset from the holder's pivot axis 95. A shaft 97 rotatably connects the cut cylinder clevis 91 and the clevis pivot block 93. When actuated, the air cylinder 85 exerts a force on the offset clevis pivot block 93 causing the holder to rotate about the pivot axis 95 between the receiving and mounting positions.

The movement of the tool and placement of edge components in the holder 75 of the tool 21 is coordinated by any suitable controller such as a controller 99 communicating with the tool 21 through input/output lines 101. The controller 99 may be part of the pick and place apparatus that is used with the tool 21.

According to the present invention, the controller 99 coordinates the functions of the tool 21 to reliably and automatically attach straddle-mounted or edge components to a printed circuit board. FIGS. 3(A), 3(B), 3(C), and 3(D) and FIGS. 4(A) and 4(B) illustrate a preferred method of attaching an edge component to a printed circuit board according to the present invention. The numbers set out in parentheses below refer to the steps of the flowchart illustrated in FIGS. 4(A) and 4(B).

A printed circuit board is moved into proximity with the straddle mount assembly tool 21 by a assembly system (111 and 112). The platform 23 is raised and accurately locates the printed circuit board on the board support plate 25 with the locator pins 33 and secures the circuit board in place with side clamps (113). A first vision system 150 mounted above the tool 21 determines if the printed circuit board is properly positioned on the support plate 25.

After a printed circuit board has been properly placed on the support plate 25, a head picks up an edge component from a tube feeder which is part of the pick and place apparatus. The head moves the edge component into proximity of a second vision system (115 and 116). The second vision system 152 checks the edge component's polarity and accurately aligns the edge component with the holder 75 before mounting the edge component on the holder 75 (117).

Figure 3D:
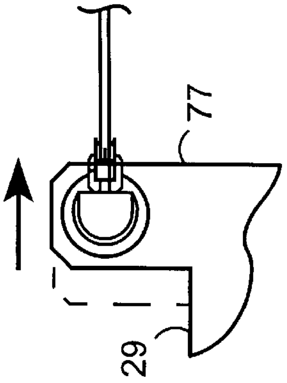
FIGS. 3(A), 3(B), 3(C), and 3(D) illustrate a sequence for mounting an edge component according to the present invention.
Figure 3C:
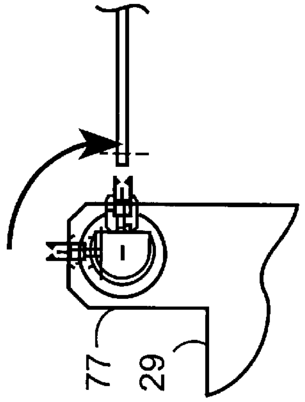
Figure 3B:
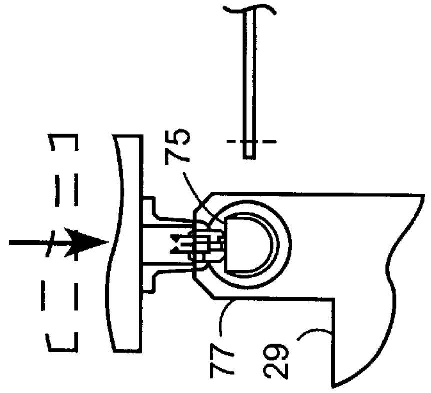
Figure 3A:
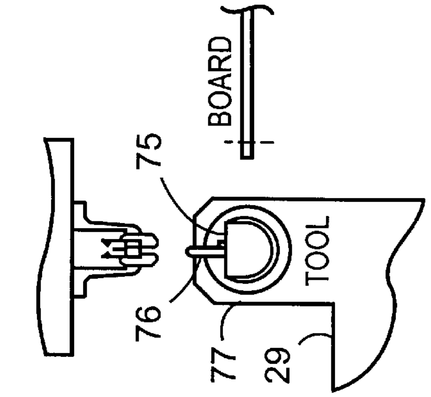
Figure 4A:
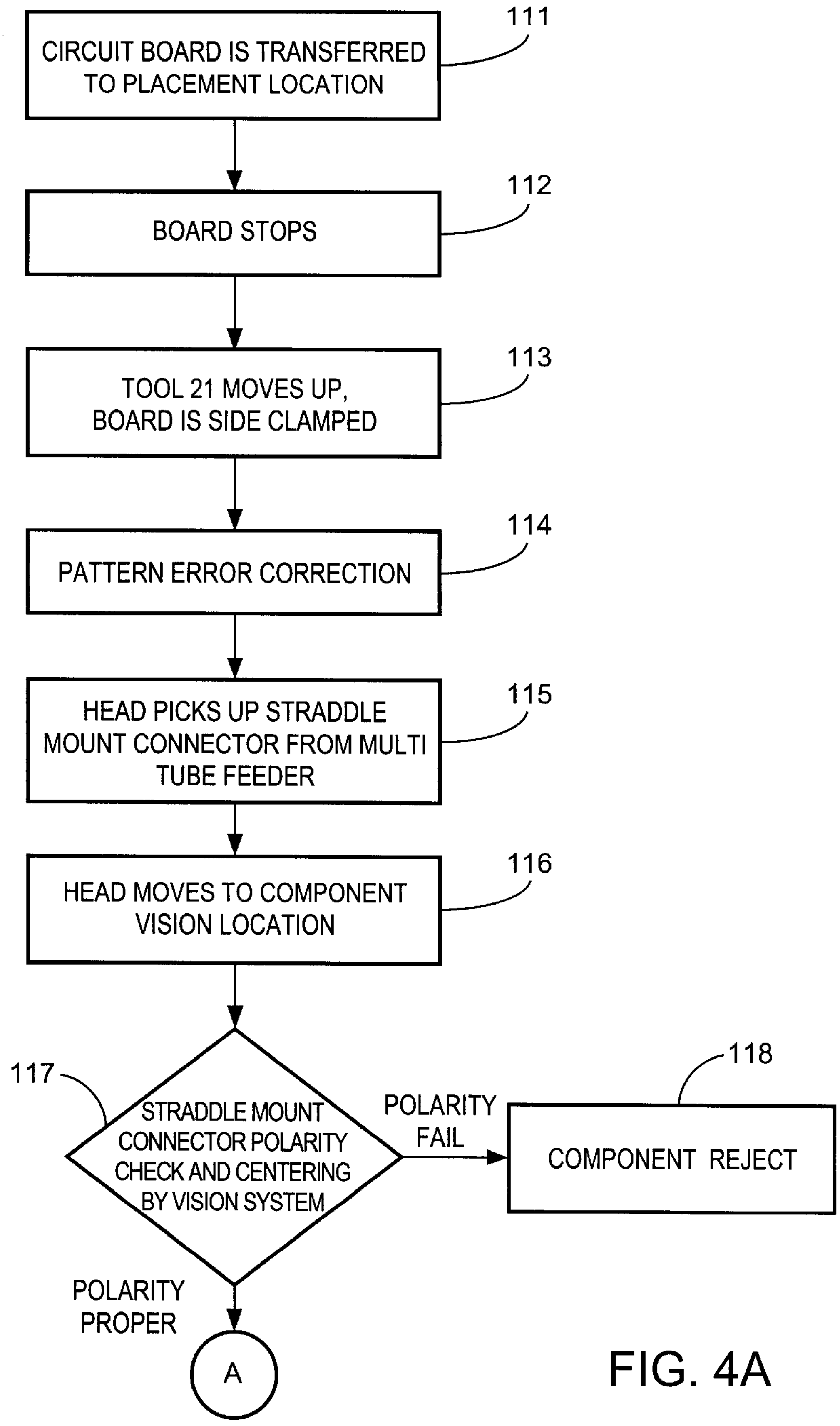
FIGS. 4(A) and 4(B) comprise a flow chart illustrating a method in accordance with the present invention.
Figure 4B:
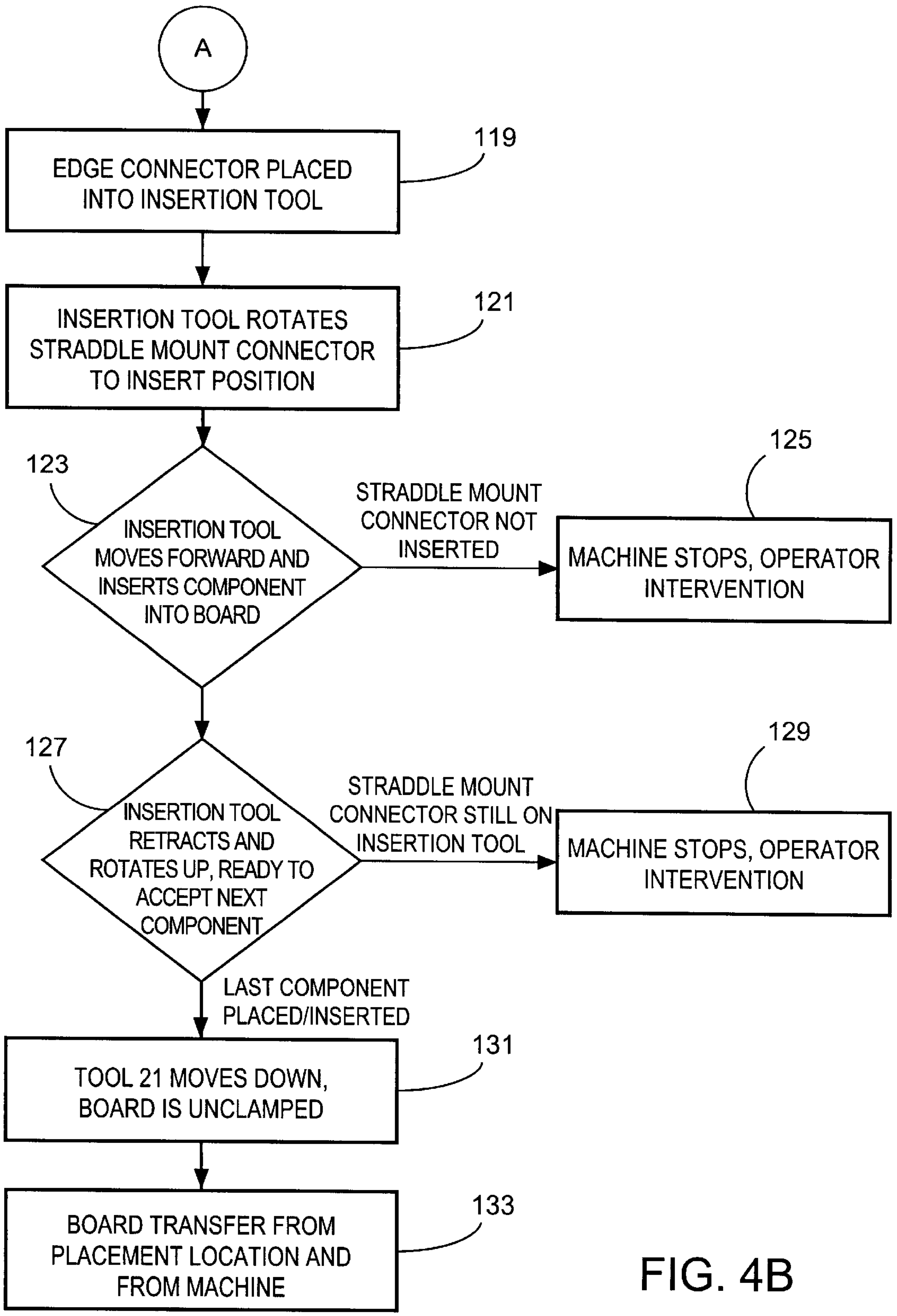

FIG. 3(A) illustrates the tool 21 at this stage, wherein the sliding member 29 is in its second (receiving) position and the holder 75 is in its first (receiving) position. And, the circuit board is properly clamped in place on the circuit board support plate 25. At this FIG. 3(A) stage, the edge component is held in position above the holder 75 in proper alignment with the holder 75.

Then, with the holder 75 in the receiving position, the edge component is positioned on the holder 75 (119). See FIG. 3(B).

Once the edge component is positioned on the holder 75, the edge component is rotated with the holder 75 from the receiving position to the second or mounting position by the air cylinder 85 (121). FIG. 3(C) illustrates the rotation of the holder 75 to the second or mounting position with the arrow. As illustrated in FIG. 3(C), the holder 75 is now in the second or mounting position.

As illustrated in FIG. 3(D), the first air cylinder 43 then exerts a force on the bell crank 47 so as to move the sliding member 29 toward the circuit board support plate 25, thereby engaging an edge of the printed circuit board mounted on the support plate 25 with the edge component held in the holder 75 (123). The air cylinder 43 exerts a force adequate to seat the edge component on the printed circuit board. A typical seating force is within the range of about 1 to 70 kilograms.

If the edge component does not properly attach to the circuit board, the tool is stopped so an operator can intervene and correct the error (125). The edge component is secured to the printed circuit board by interference between the edge component and the printed circuit board. Typically, the edge component includes resilient leads that register against conductive surfaces on the printed circuit board. Once the connecter has been secured to the printed circuit board, the first air cylinder 43 retracts the sliding member 29 away from the printed circuit board and the second air cylinder 85 rotates the holder 75 into the receiving position illustrated in FIG. 3(A) to repeat the cycle (127).

If, after the holder 75 has been rotated back into the receiving position, the edge component is still in the holder 75, the machine stops so that an operator can intervene and remedy the problem (129). After an edge component has successfully been mounted, the circuit board is released from the tool 21 and the clamps, and the cycle begins anew (131 and 133).

In this way, according to the present invention, an edge component such as a plug or receptacle component to be attached to a printed circuit board can be automatically aligned and seated in position on the printed circuit board without manual handling of the edge component. As a result, the present invention can improve the accuracy and repeatability of mounting edge components to printed circuit boards and reduce the cost of assembling printed circuit boards with edge components by reducing damage to edge components and assembly errors, as well as reducing reworking and the cycle time for seating edge components.

The present invention has been described with reference to a preferred embodiment. However, it will be readily apparent to those skilled in the art that it is possible to embody the invention in specific forms other than as described above without departing from the spirit of the invention. The exemplary embodiment is illustrative and should not be considered restrictive in any way. The scope of the invention is given by the appended claims, rather than the preceding description, and all variations and equivalents which fall within the range of the claims are intended to be embraced therein.

What is claimed is:

1. An apparatus for attaching component to an edge of a printed circuit board, the apparatus comprising:

a printed circuit board support plate for supporting a printed circuit board in a first plane;

a sensor to verify proper printed circuit board alignment in said first plane;

a sliding member being movable relative to the support plate between a first position and a second position along a second plane that is parallel to the first plane;

a first actuator connected to the sliding member, the first actuator moving the sliding member between the first position and the second position;

a robotic arm for carrying the component;

a component holder pivotally connected to one end of the sliding member, the component holder adapted to receive a component to be attached from the robotic arm and carry the component to a printed circuit board;

a vision system to verify proper alignment of said component on the robotic arm for receipt by said component holder;

a second actuator mounted on the sliding member and connected to the holder, the second actuator rotating the holder between a component receiving position and a component mounting position relative to the sliding member, whereby when the component holder is in the component mounting position, the component being carried by the component holder is in mounting alignment with an edge of a printed circuit board on the printed circuit board support plate; and a controller for controlling proper alignment of the component for attachment to the edge of the printed circuit boards;

wherein the second actuator is connected to a mount on the holder that is offset from a pivot axis of the holder.

2. The apparatus of claim 1, further comprising a platform for supporting the support plate and the sliding member.

3. The apparatus of claim 2, farther comprising a slide connected to the sliding member and the platform, the slide allowing the sliding member to move along a slide axis relative to the support plate.

4. The apparatus of claim 1, further comprising locator pins for positioning the printed circuit board on the apparatus.

5. The apparatus of claim 1, further comprising locator pins located on the component holder, the locator pins positioning the component on the component holder.

6. The apparatus of claim 1, further comprising a controller communicating with the apparatus and automatically controlling the first and second actuators.

7. The apparatus of claim 1, further comprising a bell crank interconnecting the first actuator and the sliding member.

8. An apparatus for attaching a component to an edge of a printed circuit board, the apparatus comprising;

a printed circuit board support plate for supporting a printed circuit board in a first plane;

a sensor to verify proper printed circuit board alignment in said first plane;

a sliding member being movable relative to the support plate between a first position and a second position along a second plane that is parallel to the first plane;

a first actuator connected to the sliding member, the first actuator moving the sliding member between the first position and the second position;

a robotic arm for carrying the component;

a component holder pivotally connected to one end of the sliding member, the component holder adapted to receive a component to be attached from the robotic arm and carry the component to a printed circuit board;

a vision system to verify proper alignment of said component on the robotic arm for receipt by said component holder;

a second actuator mounted on the sliding member and connected to the holder, the second actuator rotating the holder between a component receiving position and a component mounting position relative to the sliding member, whereby when the component holder is in the component mounting position, the component being carried by the component holder is in mounting alignment with an edge of a printed circuit board on the printed circuit board support plate;

a controller for controlling proper alignment of the component for attachment to the edge of the printed circuit board; and a slide connected to the sliding member and the platform, the slide allowing the sliding member to move along a slide axis relative to the support plate;

wherein the slide comprises:

a guide fixed relative to the platform; and a movable member that fits over the guide, the movable member being secured to the sliding member.

9. An apparatus for attaching a component to an edge of a printed circuit board, the apparatus comprising:

a printed circuit board support plate for supporting a printed circuit board in a first plane;

a sensor to verify proper printed circuit board alignment in said first plane;

a sliding member being movable relative to the support plate between a first position and a second position along a second plane that is parallel to the first plane;

a first actuator connected to the sliding member, the first actuator moving the sliding member between the first position and the second position;

a robotic arm for carrying the component;

a component holder pivotally connected to one end of the sliding member, the component holder adapted to receive a component to be attached from the robotic arm and carry the component to a printed circuit board;

a vision system to verify proper alignment of said component on the robotic arm for receipt by said component holder;

a second actuator mounted on the sliding member and connected to the holder, the second actuator rotating the holder between a component receiving position and a component mounting position relative to the sliding member, whereby when the component holder is in the component mounting position, the component being carried by the component holder is in mounting alignment with an edge of a printed circuit board on the printed circuit board support plate; and a controller for controlling proper alignment of the component for attachment to the edge of the printed circuit board;

wherein the first actuator is an air cylinder.

10. The apparatus of claim 9, wherein the second actuator is an air cylinder.

11. An apparatus for attaching a component to an edge of a printed circuit board, the apparatus comprising:

a printed circuit board support plate for supporting a printed circuit board in a first plane;

a sensor to verify proper printed circuit board alignment in said first plane;

a sliding member being movable relative to the support plate between a first position and a second position along a second plane that is parallel to the first plane;

a first actuator connected to the sliding member, the first actuator moving the sliding member between the first position and the second position;

a robotic arm for carrying the component;

a component holder pivotally connected to one end of the sliding member, the component holder adapted to receive a component to be attached from the robotic arm and carry the component to a printed circuit board;

a vision system to verify proper alignment of said component on the robotic arm for receipt by said component holder;

a second actuator mounted on the sliding member and connected to the holder, the second actuator rotating the holder between a component receiving position and a component mounting position relative to the sliding member, whereby when the component holder is in the component mounting position, the component being carried by the component holder is in mounting alignment with an edge of a printed circuit board on the printed circuit board support plate; and a controller for controlling proper alignment of the component for attachment to the edge of the printed circuit board;

wherein the second actuator is an air cylinder.

* * * * *